United States Patent [19]

Bourbeau et al.

[11] 4,010,489

[45] Mar. 1, 1977

[54] HIGH POWER SEMICONDUCTOR DEVICE COOLING APPARATUS AND METHOD

[75] Inventors: Frank J. Bourbeau; Barton L. Meredith, both of Santa Barbara; Arnold J. Rakowski, Goleta, all of Calif.

[73] Assignee: General Motors Corporation, Detroit, Mich.

[22] Filed: May 19, 1975

[21] Appl. No.: 578,717

[52] U.S. Cl. .................................. 357/82; 357/76; 165/80; 165/105; 174/16 B
[51] Int. Cl.² ................. H01L 25/04; H01L 23/32; F28F 7/00; H01B 7/34
[58] Field of Search ........... 357/81, 82, 76; 165/80, 165/105; 174/16 B

[56] References Cited

UNITED STATES PATENTS

| 3,502,956 | 3/1970 | Fries et al. | 357/82 |
| 3,551,758 | 12/1970 | Ferree | 357/82 |
| 3,573,574 | 4/1971 | Davis | 357/82 |
| 3,603,381 | 9/1971 | Scherbaum | 357/82 |
| 3,654,528 | 4/1972 | Barkan | 357/82 |
| 3,668,506 | 6/1972 | Beasley et al. | 357/82 |
| 3,763,402 | 10/1973 | Shore et al. | 357/82 |
| 3,768,548 | 10/1973 | Dilay et al. | 357/82 |
| 3,893,162 | 7/1975 | Weidemann | 357/82 |

FOREIGN PATENTS OR APPLICATIONS

| 1,514,679 | 6/1969 | Germany | 357/82 |

*Primary Examiner*—Andrew J. James
*Attorney, Agent, or Firm*—Robert J. Wallace

[57] ABSTRACT

A heat sink assembly is described for cooling right cylindrical packages containing high power semiconductor devices. Opposite end faces of the packages cooperate with heat sink members to provide liquid coolant flow channels in which the liquid coolant is in direct contact with the package end face. A unique compact elastomeric coolant manifold facilitates semiconductor device replacement in the assembly. The assembly, including the elastomeric manifold, is enclosed in a container and maintained submerged in coolant during use.

5 Claims, 6 Drawing Figures

HIGH POWER SEMICONDUCTOR DEVICE COOLING APPARATUS AND METHOD

BACKGROUND OF THE INVENTION

It is known to cool stacks of disc-type high power semiconductor device packages with interjacent water-cooled heat sink members. A variety of types of liquid cooled heat sink members, assemblies and methods have been proposed and patented for obtaining more effective cooling. However, because of a variety of practical problems the most conventional technique now commercially used still involves a relatively thick hollow heat sink member. The semiconductor devices are stacked between such members and clamped together. Each hollow heat sink member is individually connected to a manifold of rigid tubing. The hollow heat sink members have complex or convoluted passages in them which require complex casting techniques that increase the cost, as well as the thickness of the heat sink member. The coolant flow passages in the heat sink member are made as narrow as possible to make the member as thin as possible. Because of this, coolant must be circulated through the heat sink at a high rate of flow. This requires that the manifold supplying the liquid coolant to the heat sink members be able to withstand a high pressure without leaking. Rigid metal tubing with threaded couplings to each heat sink member can withstand such pressures without leakage. To simplify matters, the number of such connections is generally reduced by serially interconnecting small groups of heat sinks and paralleling the small groups. This, of course, means that the last member in each group is being cooled with coolant that has already been warmed by devices preceding it in its group. Accordingly, while this arrangement has its advantages, it also has disadvantages. For example, a group of devices may only be operated at the maximum performance level for the least effectively cooled device in each group.

With the heat sinks rigidly interconnected, replacement of semiconductor devices in the stack is not a simple matter. A further complication resides in the fact that semiconductor devices are registered on the heat sinks by means of a pin and complementary recess. The heat sinks must be spread far enough apart to allow the pins to become disengaged from the recess. In many instances several couplings in the coolant flow line must be disconnected. This is not only time consuming but each time a coupling is reconnected the risk of leakage is increased.

We have found an apparatus and method for more effectively cooling disc-type high power semiconductor device packages. It is more effective because liquid coolant is circulated directly in contact with the end faces of the packages, and the packages are maintained immersed in liquid coolant to provide cooling by conduction from the radial surfaces of the package. Thin heat sink members can be used because they need not be hollow. A unique elastomeric manifold integral with the assembly facilitates replacement of semiconductor device packages. Device package replacement is further enhanced by an improved device locating technique.

OBJECTS AND SUMMARY OF THE INVENTION

It is, therefore, a principal object of this invention to provide an improved cooling assembly for disc-type semiconductor device packages.

Another object of this invention is to provide an improved method of cooling disc-type semiconductor device packages.

The invention comprehends an apparatus in which an end face of a high power semiconductor device package cooperates with a contiguous plate-like heat sink member to form an imperfectly sealed coolant flow channel therebetween. One of the mating surfaces is grooved to form the coolant flow channel. A portion of the channel within the radial periphery of the device end face communicates with a coolant inlet passage within the heat sink member. The groove extends to the radial periphery of the device end face forming an outlet to the channel. The device clamps against the heat sink member and forms an assembly which is mounted within a container and submerged beneath a liquid coolant in that container. Liquid coolant is circulated through the flow channel via the heat sink and outlet into the container where it is collected. Coolant is removed from the container at a rate which keeps the devices submerged in coolant. The coolant is cooled, and then recirculated back to the heat sink member for recirculation to the flow channel.

A stack of alternate devices and heat sink members are clamped together by means of a tie bolt. No outlet manifold need be provided. The inlet manifold is a nonconductive flexible tube extending between adjacent heat sinks in the series. The flexible tube is frictionally seated in apertures in the heat sink members. The apertures, in turn, communicate with the inlet passage in each respective heat sink member. The inlet manifold can be a series of short tubes or a single tube appropriately perforated along its length. Leakage from the manifold and from the flow channels is collected in the surrounding container.

BRIEF DESCRIPTION OF THE DRAWING

Other objects, features and advantages of this invention will become more apparent from the following description of preferred embodiments thereof and from the drawing in which.

DESCRIPTION OF THE PREFERRED EMBODIMENTS

Figure 1:
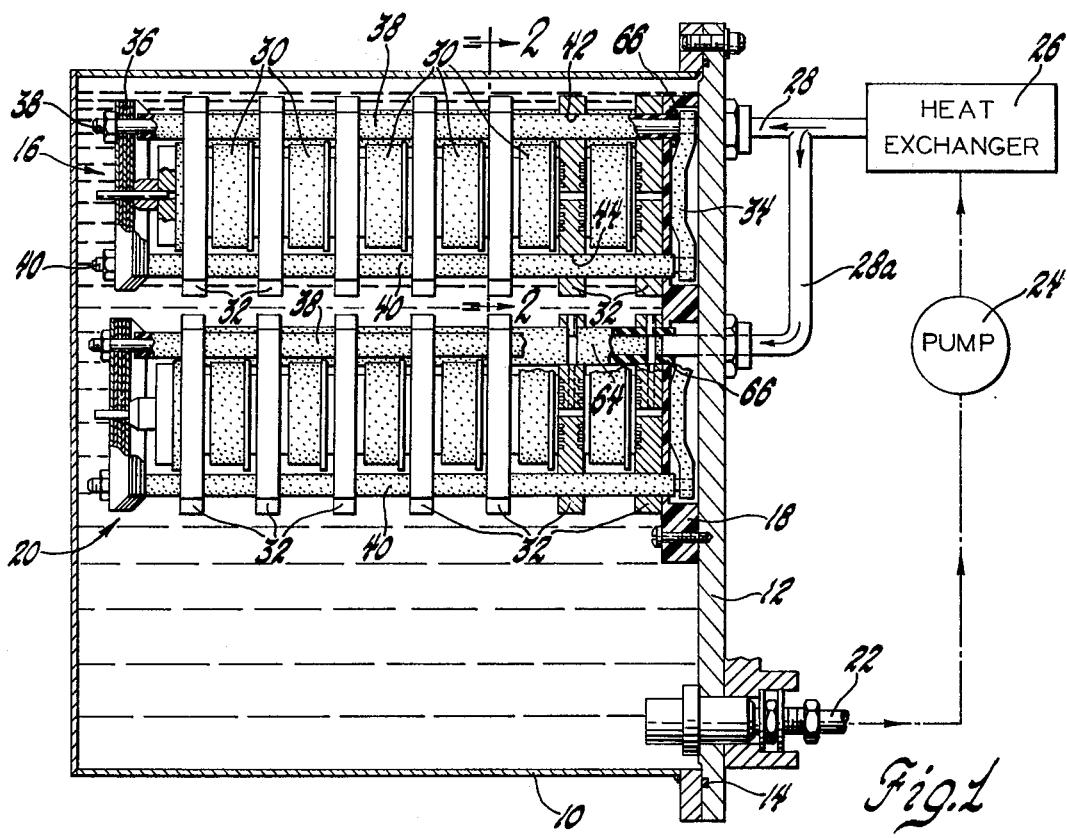
FIG. 1 is a sectional view with parts broken away and parts in elevation showing an apparatus such as contemplated by this invention.

FIG. 1 shows a closed box-like container 10 having a side cover 12 sealed at 14 with an O-ring. Container 10 is filled with a nonconductive coolant such as a transformer oil or the like. One coolant which can be used is Diala AX which is supplied by the Shell Oil Company and is described as being an insulating oil.

An assembly 16 of stacked thyristors and heat sink members is mounted within container 10 on a support 18. A stacked assembly 20 of high power rectifiers and heat sink members is also mounted on support 18 within the container 10. Both assemblies 16 and 20 are submerged under the coolant in container 10. The coolant exits the bottom portion of container 10 through a sealed connection with tubing 22. Tubing 22 is in turn connected to pump 24, which pumps the coolant through heat exchanger 26 to coolant inlet pipes 28 and 28a for circulation through assemblies 16 and 20. Inlet pipes 28 and 28a pass through container side cover 12 by means of a sealed connection.

Assemblies 16 and 20 are identical except that the semiconductor device package in assembly 16 is a high power thyristor and the semiconductor device in assembly 20 is a high power rectifier. Both semiconductor device packages can be generally characterized as short right cylinders having flat and parallel end faces formed by heat conductive electrodes. These devices are available in many forms such as the disc-like thyristors and rectifiers distributed by General Electric as Press Pak semiconductors.

Each of assemblies 16 and 20 comprises a plurality of disc-like semiconductor device units 30 sandwiched between a plurality of generally plate-like heat sink members 32. The semiconductor device units 30 and the heat sink units 32 are clamped together between an insulated end bracket 34 and a plurality of leaf springs 36 by means of tie bolts 38 and 40. Insulated tie bolt 38 passes through an aperture 42 in the heat sink member while insulated tie bolt 40 passes through an aperture 44 in the heat sink member. An internally threaded recess 46 is provided in the heat sink member 32 for making external electrical connection. They are not shown in the drawing as they form no part of this invention and would tend to confuse illustration of the cooling technique described herein.

The face portion of each heat sink member 32 in contact with a diode 30 has a spiral groove 48. Groove 48 is entirely covered by the end face of the semiconductor device, except for a free end 50. The end face of the semiconductor device 30 is registered over the main portion of the groove 48 by means of guide pins 51 and 52. When in place, the semiconductor device end face cooperates with the groove 48 to form an imperfectly sealed coolant flow passage having an outlet end 50. By imperfectly sealed, we mean that under high pressure coolant may escape out of the channel before reaching groove free end 50, since no interfacing seal is used. The coolant flow passage is imperfectly sealed, for example, since no circumferential O-ring seals are used around the outer periphery of the groove 48.

Figure 2:
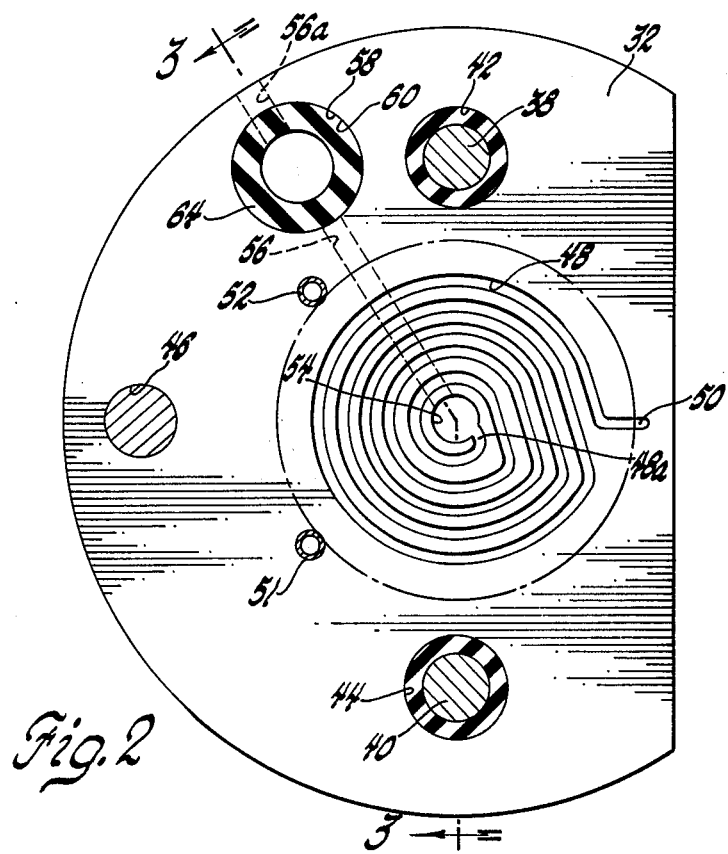
FIG. 2 is an enlarged elevational view along the line 2—2 of FIG. 1 showing a heat sink member such as used in the apparatus of FIG. 1.
Figure 4:
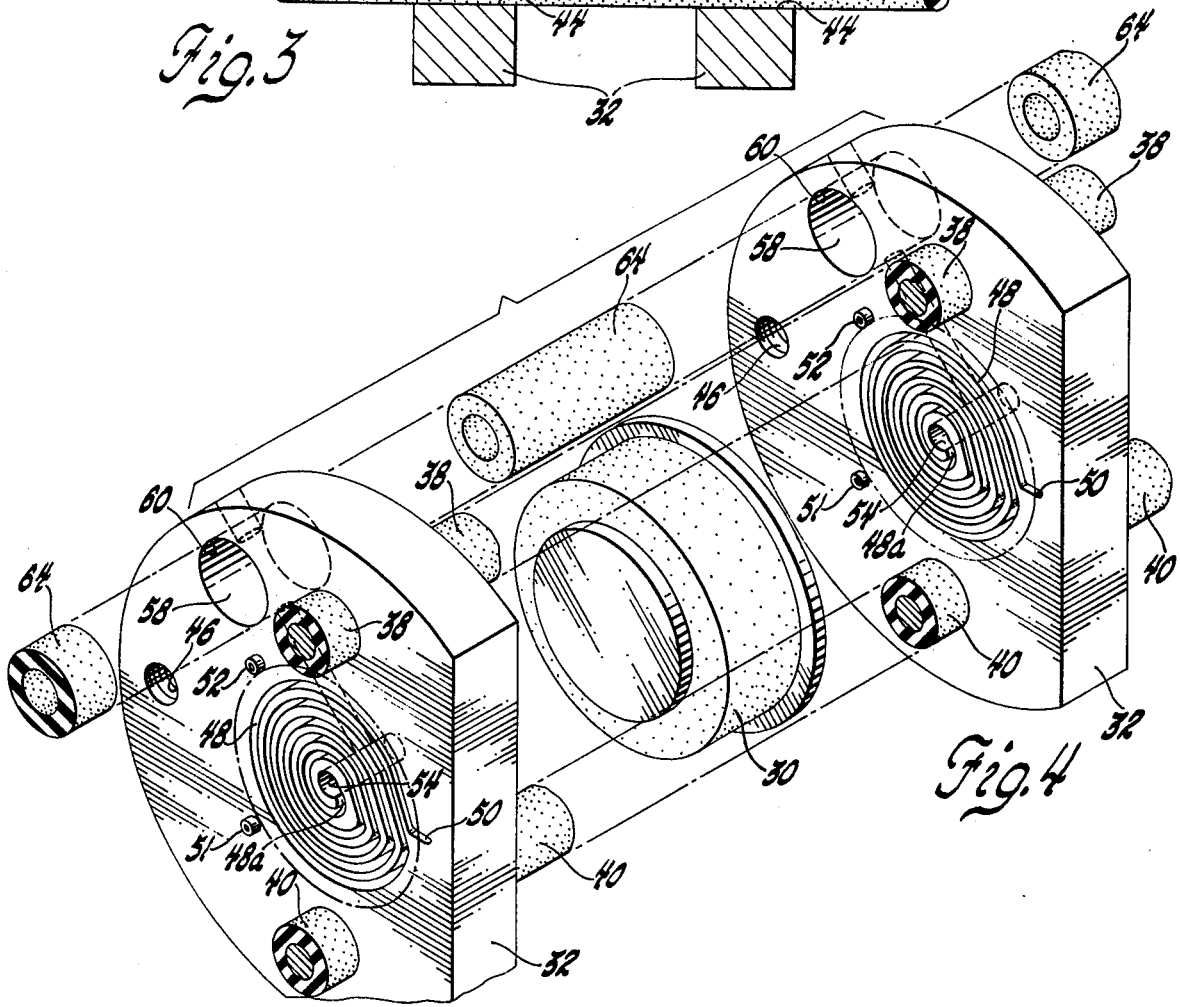
FIG. 4 is an exploded view in perspective showing the assembly portion illustrated in FIG. 3.

A central bore 54 communicates with the inner end 48a of the groove 48. The contact periphery is shown by phantom lines in FIGS. 2 and 4. If the heat sink member 32 is grooved on both faces, bore 54 communicates with the inner end of the groove 48 and 48' on each face, respectively. A bore 56 intersects bore 54 to provide an inlet passage for the groove 48 on one face of the heat sink and the groove 48' on the opposite face. Bore 56 communicates with a transverse bore 58 near the periphery of the heat sink member which provides an aperture 60 in the grooved face of the heat sink member. The outer end 56a of bore 56 is closed with a metal plug 62 which partially extends within transverse bore 58. Transverse bore 58 extends only partially through the end heat sink member 32 adjacent springs 36 to form a blind hole which intersects the bore 56 within the heat sink.

Coolant is distributed to the heat sink by means of a series of nylon reinforced rubber tubes 64 which are circumferentially frictionally seated within apertures 60 of the heat sink members 30. Apertures 60 are about 0.005 – 0.010 inch smaller than the outer diameter of the rubber tubing 64. The tube ends are centered within the heat sink member by means of the plugs 62 projecting within bore 58. A short rubber tube 66 is similarly frictionally fitted within an aperture on the outside face of the end heat sink member adjacent clamp 34 and clamped to the respective coolant inlet pipe in the normal and accepted manner. Thus, tube 66 of assembly 16 is connected to pipe 28, and tube 66 of assembly 20 is connected to pipe 28a.

The heat sink members and diodes are easily assembled with the coolant manifold. For example, with assembly 16, opposite ends of each rubber tube 64 are frictionally seated within the corresponding apertures 60 and 60' in facing surfaces of aligned adjacent heat sink members. The assembly of heat sink members and rubber tubing can be arcuately bent sufficient to permit the semiconductor device packages to be slipped into place between heat sink members. The semiconductor device packages are automatically located in register over grooves 48 by means of the locating pins 50 and 51. The diode-heat sink member stack is straightened out, tie bolts inserted, and the assembly clamped together. End coolant inlet tube 66 is seated in the open aperture 60' of the right end heat sink member and clamped to the coolant inlet pipe 28. Assembly 20 is assembled similarly. Replacement of a faulty, or failed semiconductor device 30 within the assembly is even more readily accomplished. The tie bolts 38 and 40 need only be loosened sufficiently to slide the defective semiconductor device out of position and insert a new one. No coolant inlet manifold connections need be uncoupled in the process. Moreover, since there is no outlet manifold at all, there is no need for bending, removing, uncoupling, or coupling a coolant outlet manifold.

When the device is in operation, coolant in container 10 is maintained at a sufficiently high level so that the entirety of assemblies 16 and 20 are maintained submerged in the liquid coolant. This can readily be accomplished by initially filling container 10 and associated lines, pumps and heat exchangers with coolant. Then, as coolant is recirculated through assemblies 16 and 20 container 10 will automatically remain filled with coolant and the assemblies 16 and 20 submerged under the level of the coolant. In such event the entirety of the assemblies are bathed in coolant to provide additional cooling capacity by radial contact of the coolant on the semiconductor device packages as well as additional contact of coolant with the heat sink members 32. In the event of pump failure, circulation of coolant will, of course, cease. On the other hand, the assemblies will remain bathed in liquid coolant. The conductive cooling of the liquid on the assemblies will be considerably more effective than convective cooling to air. In this connection, container 10 can be made larger than just necessary to admit assemblies 16 and 20. As shown in FIG. 1, the container 10 can be made larger to provide additional coolant capacity.

Figure 3:
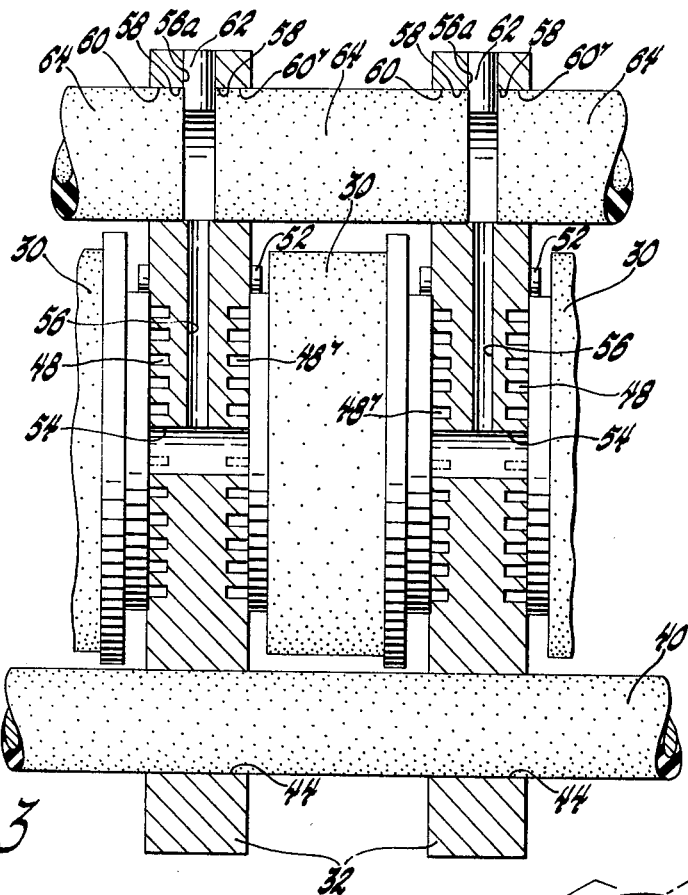
FIG. 3 is a sectional view along the line 3—3 of FIG. 2.
Figure 5:
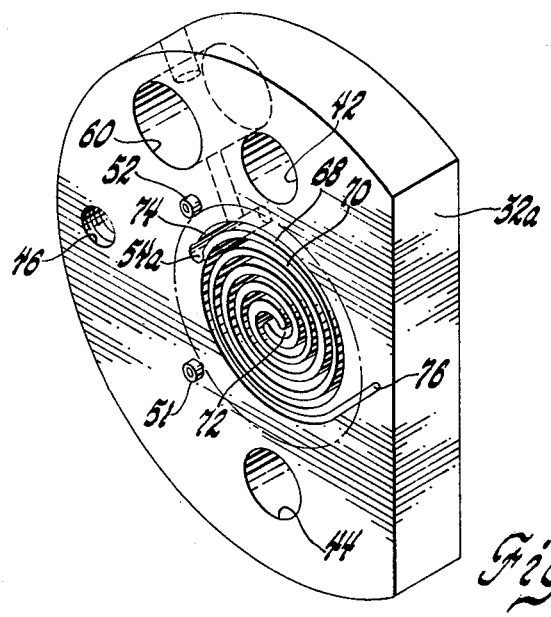
FIG. 5 is an isometric view showing an alternate grooving arrangement for the heat sink member shown in FIG. 2.

FIG. 5 shows another embodiment 32a for heat sink member 32. Heat sink member 32a is essentially the same as heat sink member 32 shown in connection with FIGS. 2 – 4. It differs essentially in the type of coolant groove which is used. FIG. 5 shows a pair of interjacent spirals 68 and 70 having their inner ends connected together at 72, and having free outer ends 74 and 76. One of the outer ends 74 is within the periphery of the semiconductor device contact area, shown in phantom line, on the heat sink member to be mounted. Outer end 74 communicates with a transverse bore 54a forming part of a coolant inlet passage. The other spiral free end 76 is extended beyond the periphery of the device contact area and forms an outlet end for the groove.

Figure 6:
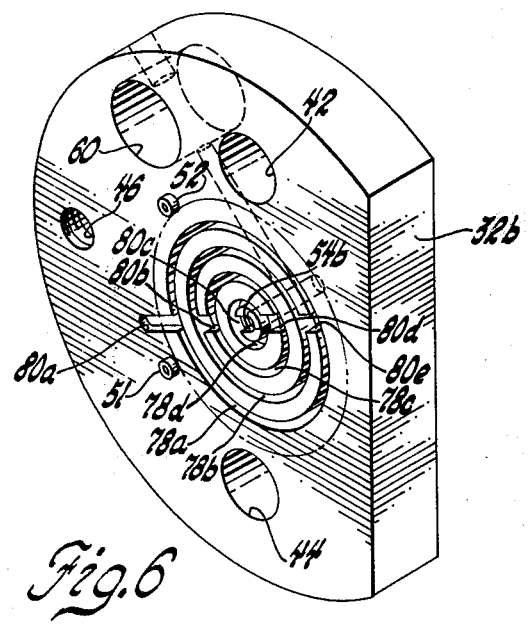
FIG. 6 is an isometric view showing a still further alternate example of grooving which can be used on the seat member shown in FIG. 2.

FIG. 6 shows still another groove form which can be used on the heat sink member. The heat sink member 32b shown in FIG. 6 is essentially the same as heat sink member 32 shown in connection with FIGS. 2 – 4. However, in FIG. 6, the groove form is a series of concentric grooves 78a, 78b, 78c and 78d that are interconnected with a transverse segmented linear groove 80a, 80b, 80c, 80d and 80e. The central groove 78d communicates via linear groove segment 78c with a transverse coolant inlet bore 54b, analogous to bore 54 in heat sink member 32. The concentric grooves are entirely within the periphery of the semiconductor device contact area, shown in phantom line, on the heat sink member 32b. Only linear groove segment 80a is outside of this periphery and forms a coolant outlet. As can be seen, the linear groove alternately intersects the concentric grooves. This provides a more extended flow path from the inlet to the outlet of the coolant flow passage which the groove forms when the heat sink member 32b is assembled with a semiconductor device.

It is to be understood that a variety of other types of grooves can also be used to provide effective cooling within the scope of this invention. Also, the groove may even be provided in the semiconductor package and face instead of, or in addition to, a groove in the heat sink member.

We claim:
1. Apparatus for liquid cooling high power semiconductor devices having oppositely disposed flat and parallel end faces substantially perpendicular to a central axis on said devices and forming terminals for said devices, said apparatus comprising:
    at least two axially aligned heat sink members for supporting said semiconductor devices;
    each of said heat sink members having a flat face portion adapted for contact with the flat terminal end of a high power rectifier package;
    a tortuous groove in a mating face portion of said device terminals and said heat sink members to provide a liquid coolant circulation channel in which liquid coolant directly contacts the end face of said device;
    an inlet passage in each of said heat sink members communicating with said groove for introducing liquid coolant into said circulation channel for circulation against said flat terminal end;
    at least one outer end portion on each of said grooves exposed at the radial periphery of contact between said terminal end and said heat sink member, providing an outlet for liquid coolant circulated through said circulation channel from said inlet passage for said groove;
    means for clamping said heat sink members against their respective terminal end faces of said high power semiconductor device with each terminal end face cooperating with its respective heat sink to form said circulation channel with a circulation channel outlet at the periphery of said terminal end face;
    said faces of said heat sink members having apertures therein communicating with said inlet passages;
    flexible and resilient liquid coolant conduit means extending between said faces of said heat sink members and circumferentially frictionally engaging said apertures in a sealing relationship;
    aperture means in said liquid coolant conduit means communicating with said inlet passages;
    one of said heat sink member apertures being one end of a bore extending through said heat sink member;
    means for introducing a nonconductive liquid coolant to the other end of said bore for circulation through both of said grooves;
    a container enclosing said heat sink members for receiving coolant from said groove outlets and any coolant resulting from leakage, and for maintaining said heat sink members immersed in said coolant; and
    means for withdrawing liquid coolant from said container, cooling it, and recirculating it back to said heat sink bore.

2. Apparatus for liquid cooling high power semiconductor device packages having oppositely disposed flat and parallel end faces substantially perpendicular to a central axis on said package and forming terminals for said devices, said apparatus comprising:
    at least two axially aligned heat sink members;
    each of said heat sink members having a flat face portion adapted for contact with the flat terminal end of a high power rectifier package;
    a tortuous groove in said face portion of each of said heat sink members for respective cooperation with each end face of said high power semiconductor device terminal to provide a liquid coolant circulation channel therewith in which liquid coolant directly contacts the end fact of said device;
    an inlet passage in each of said heat sink members communicating with said groove for introducing liquid coolant into said circulation channel for circulation against said flat terminal end;
    at least one outer end portion on each of said grooves not for cooperation with its respective flat terminal end and providing an outlet for said liquid coolant circulated through said channel from said inlet passage for said groove;
    means for clamping said heat sink members against their respective terminal end faces of said high power semiconductor device with each terminal end face covering its respective groove to form said circulation channel, and not covering said groove outer end portion to form a circulation channel outlet;
    said faces of said heat sink members having apertures therein communicating with said inlet passages;
    elastomeric liquid coolant conduit means extending between said faces of said heat sink members and circumferentially frictionally engaging said apertures in a sealing relationship;

aperture means in said elastomeric liquid coolant conduit means communicating with said inlet passages;

one of said heat sink member apertures being one end of a bore extending through said heat sink member;

means for introducing a nonconductive liquid coolant to the other end of said bore for circulation through both of said grooves;

a container enclosing said heat sink members for receiving coolant from said groove outlets and any coolant resulting from leakage and for maintaining said heat sink members immersed in said coolant; and means for withdrawing liquid coolant from said container, cooling it, and recirculating it back to said heat sink bore.

3. An apparatus for liquid cooling high power semiconductor device packages having generally cylindrical body members with mutually parallel disc electrodes on opposite ends that are axially aligned and have flat outer faces, said apparatus comprising:

a series of axially aligned generally plate-like heat sink members;

each of said heat sink members having two opposite major faces;

at least a portion of each of said major faces being flat and parallel with such portions on the other heat sink members and axially aligned therewith for contact with axially aligned flat and mutually parallel electrode end faces on a generally right cylindrical high power semiconductor device package;

each of said face portions on said heat sink members being grooved for respective cooperation with a flat end face on said device package to provide a liquid coolant circulation channel in which liquid coolant directly contacts said device package end face;

the groove in each of said portions including a pair of interjacent spirals having free outer ends and interconnected inner ends;

one of said interjacent spirals, including its free end, being completely within an area of the heat sink portion against which a package electrode end face is clamped;

the other of said spirals being within said area except for its free end;

coolant inlet means in each of said heat sink members communicating with the spiral free end within said area on both of said members two opposite major faces;

device package abutment means on said heat sink member face portions for registering said device package on said areas;

means for clamping said device packages between said heat sink members, with the packages axially aligned and their flat end faces contacting and registered on said areas of said flat portions of said heat sink members to form liquid coolant circulation channels with said heat sink member grooves and electrically contact device packages;

a bore through each interior and at least one end heat sink member in said series adjacent said areas thereon providing an aperture in both major faces of the heat sink member communicating with the liquid coolant inlet means in said heat sink member;

an aperture in the inward face of the opposite end heat sink member in said series communicating with the liquid coolant inlet means therein;

said heat sink member apertures being axially aligned;

elastomeric liquid coolant conduit means extending between near faces of adjacent heat sink members and outwardly from one end heat sink member, said conduit means circumferentially frictionally engaging said heat sink member apertures in a sealing relationship;

aperture means in said elastomeric liquid coolant conduit means communicating with said inlet passages;

means for introducing a nonconductive liquid coolant to the conduit means on said one end heat sink member for circulation through said conduit means and thereby in parallel through all of said grooves in all of said heat sink members;

a container enclosing said heat sink members for receiving coolant from said groove outlet and any coolant resulting from leakage and for maintaining said heat sink members immersed in said coolant; and means for withdrawing liquid coolant from said container, cooling it, and recirculating it back to said end heat sink member.

4. A method for liquid cooling semiconductor device packages having a heat conductive face comprising:

forming an imperfectly sealed liquid coolant flow channel between a heat conductive face on a high power semiconductor device package and a mating face of a heat sink member, said channel being a groove in one of said faces that communicates with a coolant inlet in said heat sink member and has an outlet at the periphery of said package face;

clamping said package and heat sink together to form an assembly with an imperfectly sealed coolant flow channel directly in contact with said heat conductive package end face;

enclosing said assembly in a substantially sealed container;

submerging said assembly in a nonconductive coolant in said container whereby substantially the entirety of said device is bathed in said liquid coolant;

circulating said coolant through said channel via said heat sink inlet passage;

collecting in said container coolant exiting said channel from said outlet and escaping from said imperfectly sealed channel;

removing said coolant from said container at a rate which will maintain said assembly submerged in said coolant;

cooling said coolant; and recirculating said coolant back to said heat sink for pumping through said groove.

5. A method of cooling high power semiconductor device packages having substantially flat and parallel heat conductive end faces, said method comprising the steps of;

frictionally sealing opposite ends of a nonconductive flexible tube in apertures in facing surface portions of generally plate-like metallic members that have liquid coolant inlet passages communicating said apertures with adjacent surface portion grooves having a periphery larger than said package end faces;

forming imperfectly sealed liquid coolant flow channels between said package end faces and said metallic members by registering each of said end faces over one of said grooves, leaving an outer periphery of said grooves uncovered, and thereby providing an outlet end for each of said channels;

clamping said metallic members against said package end faces to form an assembly with an imperfectly sealed coolant flow channel directly in contact with said package end face;

enclosing said assembly in a substantially sealed container;

submerging said assembly in a nonconductive liquid coolant in said container whereby substantially the entirety of said device and said metallic plate-like members are bathed in said liquid coolant;

pumping additional nonconductive liquid coolant into an opening in one of said metallic members that communicates with its tube aperture, whereby said additional coolant is circulated in parallel through said coolant flow channels;

collecting in said container coolant exiting said outlet ends of said channels and any coolant leaking from said imperfectly sealed channels and from said apertures;

removing said coolant from said container at a rate which will maintain said assembly submerged in said coolant;

cooling said coolant; and recirculating said coolant to said one metallic member for parallel recirculation through said coolant flow channels.

* * * * *